(12) United States Patent
Li et al.

(10) Patent No.: US 6,643,109 B1
(45) Date of Patent: Nov. 4, 2003

(54) FULLY SYNTHESISABLE AND HIGHLY AREA EFFICIENT VERY LARGE SCALE INTEGRATION (VLSI) ELECTROSTATIC DISCHARGE (ESD) PROTECTION CIRCUIT

(75) Inventors: Xiaoming Li, Irvine, CA (US); Mark R. Tennyson, Irvine, CA (US); Eugene R. Worley, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 259 days.

(21) Appl. No.: 09/672,165

(22) Filed: Sep. 27, 2000

(51) Int. Cl.[7] .................................................. H02H 3/20
(52) U.S. Cl. ........................ 361/56; 361/91.5; 361/111
(58) Field of Search ........................... 361/56, 91, 58, 361/111, 118, 117; 307/540, 304, 310; 327/320, 321, 318, 78; 323/270

(56) References Cited

U.S. PATENT DOCUMENTS 5,239,440 A * 8/1993 Merrill ........................ 361/91
5,345,357 A * 9/1994 Pianka ........................ 361/56
5,508,649 A * 4/1996 Shay ......................... 327/318
5,559,659 A * 9/1996 Strauss ....................... 361/56
5,610,790 A * 3/1997 Staab et al. .................. 361/56
5,838,146 A * 11/1998 Singer ....................... 323/270
5,907,464 A    5/1999 Maloney et al.
5,946,177 A * 8/1999 Mille et al. ................... 361/56
5,956,219 A * 9/1999 Maloney ...................... 361/56

FOREIGN PATENT DOCUMENTS

EP          0 694 969 A2    1/1996

* cited by examiner

Primary Examiner—Rajnikant B. Patel
(74) Attorney, Agent, or Firm—Farjami & Farjami LLP

(57) ABSTRACT

An electrostatic discharge (ESD) protection circuit comprises a P-channel field effect transistor (PFET), a buffer and a damping network to provide improved protection for an integrated circuit against high-voltage ESD pulses. The ESD protection circuit is capable of being fabricated with a reduced surface area layout to be fully synthesisable with the integrated circuit which it is designed to protect.

22 Claims, 3 Drawing Sheets

FULLY SYNTHESISABLE AND HIGHLY AREA EFFICIENT VERY LARGE SCALE INTEGRATION (VLSI) ELECTROSTATIC DISCHARGE (ESD) PROTECTION CIRCUIT

BACKGROUND OF THE INVENTION

1. Field of the Invention

The present invention relates to electronic circuits, and more particularly, to circuits for protection against electrostatic discharge (ESD). 2. Background In order to protect solid state integrated circuits against electrostatic discharge, a variety of ESD protection circuits have been designed which absorb the energy of the electrostatic discharge, thereby protecting the integrated circuits from damage resulting from the high voltage pulses of the electrostatic discharge. A conventional circuit for ESD protection typically occupies a large surface area in an integrated circuit chip because it has very large transistor components. For example, large N-channel field effect transistors (NFETs) have been implemented as clamps in conventional circuits for ESD protection to absorb the high voltage, short duration pulses of electrostatic discharge. However, because of the large size of the transistors, conventional circuits for ESD protection are usually non-synthesisable with the integrated circuit which it is designed to protect. Furthermore, a conventional circuit for ESD protection with a large NFET clamp needs an N-well resistor connected to the drain of the NFET. Variations of the N-well resistor values due to uncertainties in existing foundry processes may cause ESD failures in conventional circuits with large NFET clamps.

SUMMARY OF THE INVENTION

The present invention provides an electrostatic discharge (ESD) protection circuit, roughly comprising:

a P-channel field effect transistor (PFET) having a source capable of receiving a source voltage at a source input that is susceptible to electrostatic discharge, a drain that is grounded, and a gate capable of receiving either a high voltage to turn off the PFET or a low voltage to turn on the PFET;

a buffer connected to the gate of the PFET; and a damping network connected to the buffer.

Advantageously, the ESD protection circuit in an embodiment according to the present invention is capable of providing improved protection against ESD failure for integrated circuits. Furthermore, the ESD protection circuit in an embodiment according to the present invention is highly area efficient and fully synthesisable with the integrated circuit which it is designed to protect from electrostatic discharge.

BRIEF DESCRIPTION OF THE DRAWINGS

The present invention will be described with particular embodiments thereof, and references will be made to the drawings in which.

DETAILED DESCRIPTION

Figure 1:
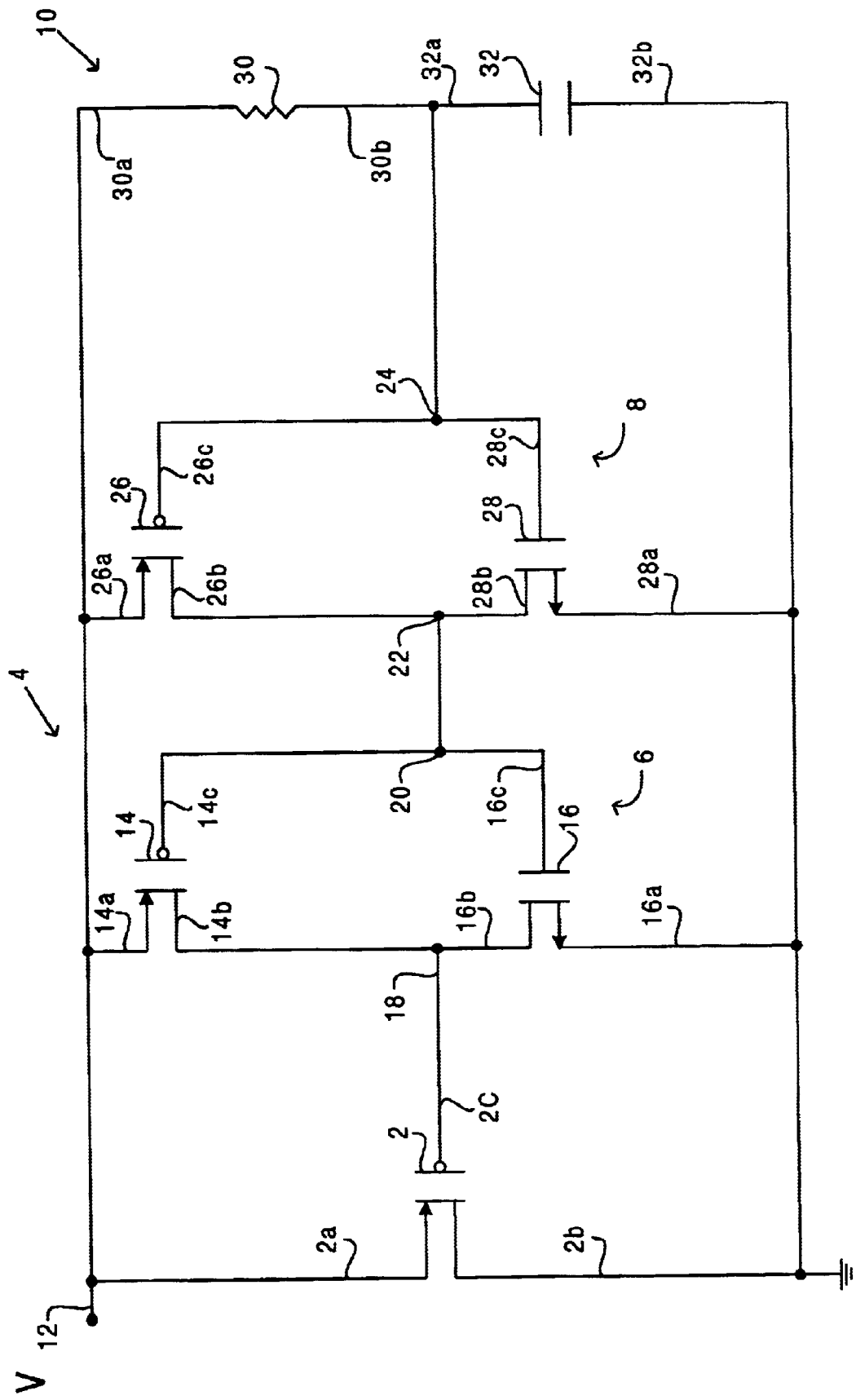
FIG. 1 shows a diagram of an embodiment of an electrostatic discharge (ESD) protection circuit.

FIG. 1 shows a diagram of an embodiment of a circuit for electrostatic discharge (ESD) protection, comprising a P-channel field effect transistor (PFET) 2, a buffer 4 which comprises first and second complementary metal oxide semiconductor (CMOS) inverters 6 and 8 connected together, and a damping network 10. The PFET 2 has a source 2a which is connected to a source input 12 to receive a source voltage V, a drain 2b that is grounded, and a gate 2c that is capable of receiving either a high voltage from the first CMOS inverter 6 to turn off the PFET 2 or a low voltage to turn on the PFET 2.

The source input 12 is susceptible to electrostatic discharge typically in the form of short duration, high voltage pulses. In the embodiment shown in FIG. 1, the source 2a of the PFET 2 is directly connected to the source input 12 without an intermediary resistor. In an embodiment, the PFET 2 has a relatively large device area when implemented on a semiconductor substrate to allow it to absorb the ESD pulses which may be carried to the source input 12. For example, in an implementation in which the PFET 2 is designed to absorb ay "human body model" ESD pulse, which is known to a person skilled in the art, the layout of the PFET 2 comprises six slices each comprising 48 PFET fingers, each of the fingers having a width of 11.4 $\mu$m and a length of 0.35 $\mu$m using existing 0.35 $\mu$m process technology known to a person skilled in the art.

In the embodiment shown in FIG. 1, the first CMOS inverter 6 comprises a PFET 14 and an N-channel field effect transistor (NFET) 16. The source 14a of the PFET 14 is connected to the source input 12, and the source 16a of the NFET 16 is connected to ground. The drain 14b of the PFET 14 is connected to the drain 16b of the NFET 16 to form the output 18 of the first CMOS inverter 6. In the embodiment shown in FIG. 1, the output 18 of the first CMOS inverter 6 is connected to the gate 2c of the PFET 2.

The gate 14c of the PFET 14 and the gate 16c of the NFET 16 are connected together to form the input 20 to the first CMOS inverter 6. In the embodiment shown in FIG. 1, the second CMOS inverter 8 has substantially the same configuration as that of the first CMOS inverter 6. The second CMOS inverter 8 has an output 22 which is connected to the input 20 of the first CMOS inverter 6 and an input 24 which is connected to the damping network 10. In the embodiment shown in FIG. 1, the second CMOS inverter 8 comprises a PFET 26 and an NFET 28. The source 26a of the PFET 26 is connected to the source input 12, whereas the source 28a of the NFET 28 is connected to ground. The drain 26b of the PFET 26 and the drain 28b of the NFET 28 are connected together to form the output 22 of the second CMOS inverter 8. The gate 26c of the PFET 26 and the gate 28c of the NFET 28 are connected together to form the input 24 to the second CMOS inverter 8.

In the embodiment shown on FIG. 1, a high voltage at the input 24 of the second CMOS inverter 8 results in a high voltage at the output 18 of the first CMOS inverter 6, which turns off the PFET 2. Conversely, a low voltage at the input 24 of the second CMOS inverter 8 results in a low voltage at the output 18 of the first CMOS inverter 6, which turns on the PFET 2. The CMOS inverters 6 and 8 together form a buffer 4 which relays voltage signals from the input 24 of the second CMOS inverter 8 to the output 18 of the first CMOS inverter 6, but does not allow a current to flow between the input 24 and the output 18. Both the first CMOS inverter 6 and the second CMOS inverter 8 are biased by the source voltage V at the source input 12.

In the embodiment shown in FIG. 1, the damping network 10 comprises a resistor 30 having a first terminal 30a connected to the source input 12 and a second terminal 30b connected to the input 24 of the second CMOS inverter 8, and a capacitor 32 having a first terminal 32a connected to the input 24 of the second CMOS inverter 8 and a second terminal 32b connected to ground. The damping network 10 dissipates the energy of a high voltage ESD pulse which may be received at the source input 12. In the embodiment shown in FIG. 1, the damping network 10 and the buffer 4 formed by the two CMOS inverters 6 and 8 connected together perform the function of damping an electrostatic discharge which may be present at the source input 12.

Figure 2:
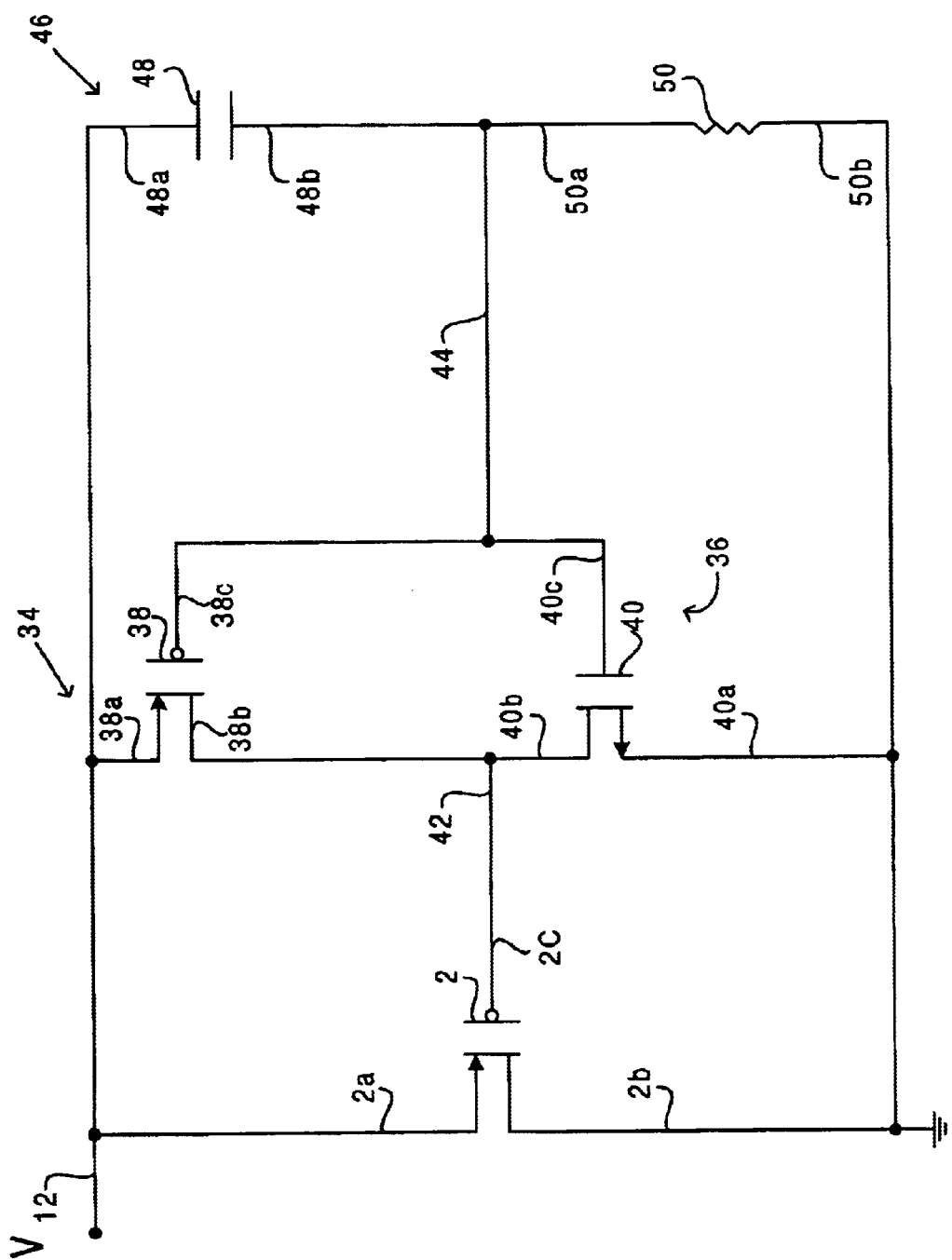
FIG. 2 shows a diagram of another embodiment of the ESD protection circuit.

FIG. 2 shows another embodiment of a circuit for ESD protection according to the present invention, in which a buffer 34 comprising a single CMOS inverter 36 is connected to the PFET 2. In this embodiment, the CMOS inverter 36 comprises a PFET 38 and an NFET 40. The source 38a of the PFET 38 is connected to the source input 12, whereas the source 40a of the NFET 40 is connected to ground. The drain 38b of the PFET 38 is connected to the drain 40b of the NFET 40 to form the output 42 of the CMOS inverter 36. The gate 38c of the PFET 38 and the gate 40c of the NFET 40 are connected together to form the input 44 of the CMOS inverter 36. A high voltage at the input 44 of the CMOS inverter 36 produces a low voltage at the output 42, which turns on the PFET 2. Conversely, a low voltage at the input 44 of the CMOS inverter 36 produces a high voltage at the output 42, which turns off the PFET 2.

In the embodiment shown in FIG. 2, a damping network 46 which comprises a capacitor 48 and a resistor 50 is connected to the buffer 34. In this embodiment, the capacitor 48 has a first terminal 48a which is connected to the source input 12 and a second terminal 48b which is connected to the input 44 of the CMOS inverter 36. The resistor 50 has a first terminal 50a which is connected to the input 44 of the CMOS inverter 36 and a second terminal 50b which is connected to ground. The damping network 46 and the buffer 34 together perform the function of damping an electrostatic discharge which may be present at the source input 12. The CMOS inverter 36 is biased by the source voltage V at the source input 12 and no current flows between the input 44 and the output 42 of the CMOS inverter 36.

Figure 3:
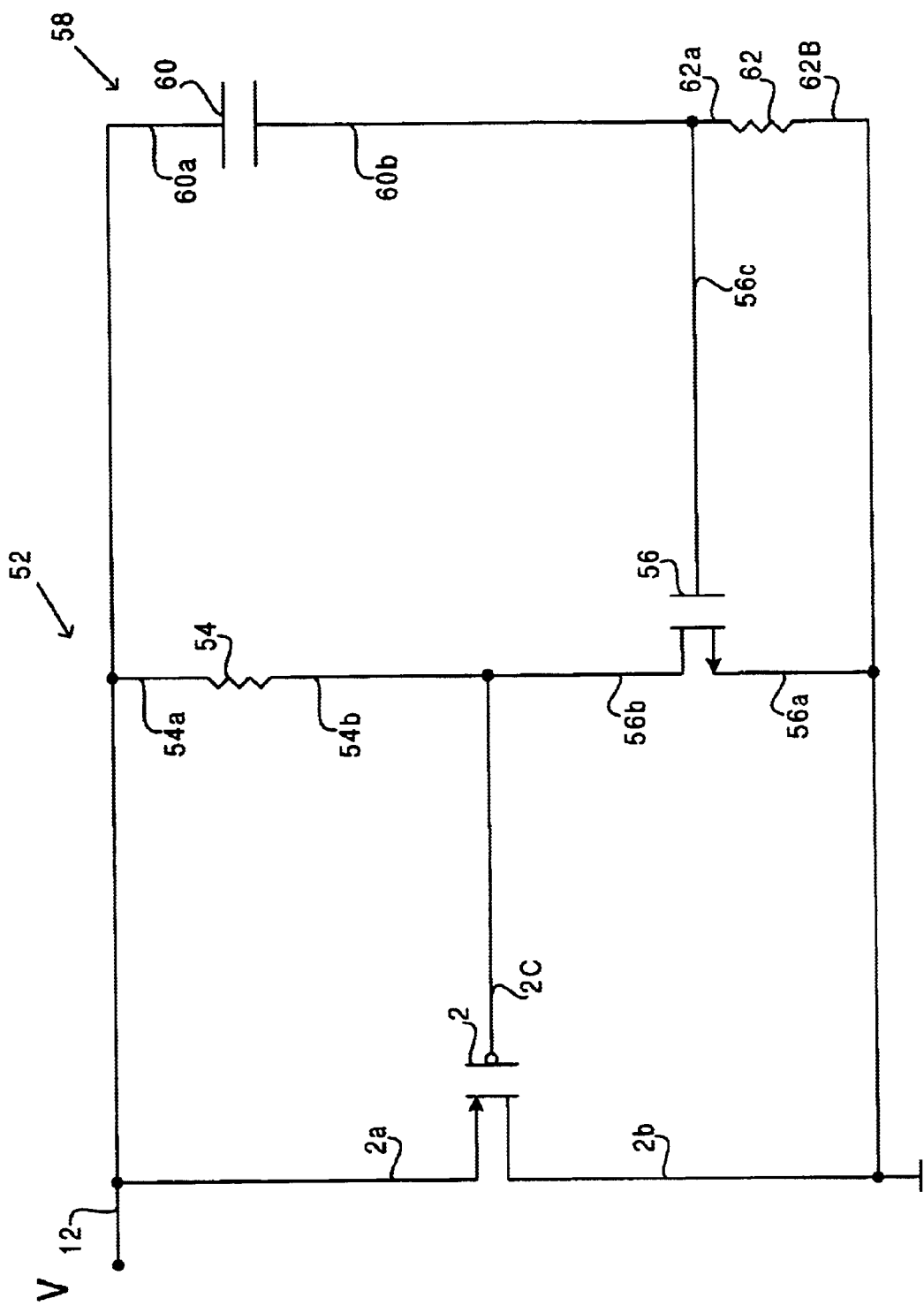
FIG. 3 shows a diagram of yet another embodiment of the ESD protection circuit.

FIG. 3 shows a circuit diagram of yet another embodiment in which only one PFET and one NFET are implemented for ESD protection. In this embodiment, the PFET 2 has a source 2a which is connected to the source input 12 carrying the bias voltage V, a drain 2b which is grounded, and a gate 2c which is connected to a buffer 52. In this embodiment, the buffer 52 comprises a resistor 54 and an NFET 56 connected together. The resistor 54 has a first terminal 54a which is connected to the source input 12 and a second terminal 54b which is connected to the gate 2c of the PFET 2. The source 56a of the NFET 56 is grounded while the drain 56b of the NFET 56 is connected to the gate 2c of the PFET 2 and the second terminal 54b of the resistor 54.

In the embodiment shown in FIG. 3, a damping network 58 which comprises a capacitor 60 and a resistor 62 is connected to the buffer 52. The capacitor 60 has a first terminal 60a which is connected to the source input 12 and a second terminal 60b which is connected to the gate 56c of the NFET 56. The resistor 62 has a first terminal 62a which is connected to the gate 56c of the NFET 56 and a second terminal 62b which is connected to ground. In this embodiment, the resistor 54 serves as a pull-up resistor while the resistor 62 serves as a pull-down resistor. The resistors 54 and 62, the NFET 56 and the capacitor 60 together perform the function of damping an electrostatic discharge which may be present at the source input 12 of the circuit.

From the above description of the invention it is manifest that various equivalents can be used to implement the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many equivalents, rearrangements, modifications, and substitutions without departing from the scope of the invention.

What is claimed is:

1. An electrostatic discharge (ESD) protection circuit, comprising:

a discharge transistor comprising a single P-channel field effect transistor (PFET) having a source capable of receiving a source voltage at a source input that is susceptible to electrostatic discharge, a drain that is grounded, and a gate capable of receiving either a high voltage to turn off the PFET or a low voltage to turn on the PFET;

a buffer connected to the gate of the PFET; and a damping network connected to the buffer.

2. The circuit of claim 1, wherein the buffer comprises a first inverter biased by the source voltage and having an input and an output, the output of the first inverter connected to the gate of the PFET.

3. The circuit of claim 2, wherein the first inverter comprises:

a second PFET having a source connected to the source input, a drain, and a gate; and a first N-channel field effect transistor (NFET) having a drain connected to the drain of the second PFET to form the output of the first inverter, a source that is grounded, and a gate connected to the gate of the second PFET to form the input of the first inverter.

4. The circuit of claim 2, wherein the damping network comprises:

a capacitor connected between the input of the first inverter and the source input; and a resistor having a first terminal connected to the input of the first inverter and a second terminal that is grounded.

5. The circuit of claim 2, wherein the buffer further comprises a second inverter biased by the source voltage and having an input and an output, the output of the second inverter connected to the input of the first inverter, the input of the second inverter connected to the damping network.

6. The circuit of claim 5, wherein the second inverter comprises:

a third PFET having a source connected to the source input, a drain, and a gate; and a second NFET having a drain connected to the drain of the third PFET to form the output of the second inverter, a source that is grounded, and a gate connected to the gate of the third PFET to form the input of the second inverter.

7. The circuit of claim 5, wherein the damping network comprises:

a resistor connected between the input of the second inverter and the source input; and a capacitor having a first terminal connected to the input of the second inverter and a second terminal that is grounded.

8. The circuit of claim 1, wherein the buffer comprises:

a first resistor connected between the source input and the gate of the PFET; and an NFET having a drain connected to the gate of the PFET, a source that is grounded, and a gate.

9. The circuit of claim 8, wherein the damping network comprises:

a second resistor having a first terminal connected to the gate of the NFET and a second terminal that is grounded; and a capacitor connected between the source input and the gate of the NFET.

10. An electrostatic discharge (ESD) protection circuit, comprising:

a discharge transistor comprising a single P-channel field effect transistor (PFET) having a source capable of receiving a source voltage at a source input that is susceptible to electrostatic discharge, a drain that is grounded, and a gate capable of receiving either a high voltage to turn off the PFET or a low voltage to turn on the PFET;

first and second inverters biased by the source input and each having an input and an output, the output of the first inverter connected to the gate of the PFET, the input of the first inverter connected to the output of the second inverter; and a damping network connected to the input of the second inverter.

11. The circuit of claim 10, wherein the first inverter comprises:

a second PFET having a source connected to the source input, a drain, and a gate; and a first N-channel field effect transistor (NFET) having a drain connected to the drain of the second PFET to form the output of the first inverter, a source that is grounded, and a gate connected to the gate of the second PFET to form the input of the first inverter.

12. The circuit of claim 11, wherein the second inverter comprises:

a third PFET having a source connected to the source input, a drain, and a gate, and a second NFET having a drain connected to the drain of the third PFET to form the output of the second inverter, a source that is grounded, and a gate connected to the gate of the third PFET to form the input of the second inverter.

13. The circuit of claim 10, wherein the damping network comprises:

a resistor connected between the input of the second inverter and the source input; and a capacitor having a first terminal connected to the input of the second inverter and a second terminal that is grounded.

14. An electrostatic discharge (ESD) protection circuit, comprising:

a discharge transistor comprising a single P-channel field effect transistor (PFET) having a source capable of receiving a source voltage at a source input that is susceptible to electrostatic discharge, a drain that is grounded, and a gate capable of receiving either a high voltage to turn off the PFET or a low voltage to turn on the PFET; and means for damping the electrostatic discharge at the source input.

15. The circuit of claim 14, wherein the means for damping the electrostatic discharge comprises:

a buffer connected to the gate of the PFET; and a damping network connected to the buffer.

16. The circuit of claim 15, wherein the buffer comprises a first complementary metal oxide semiconductor (CMOS) inverter biased by the source voltage and having an input and an output, the output of the first CMOS inverter connected to the gate of the PFET.

17. The circuit of claim 16, wherein the damping network comprises:

a capacitor connected between the input of the first inverter and the source input; and a resistor having a first terminal connected to the input of the first inverter and a second terminal that is grounded.

18. The circuit of claim 16, wherein the buffer further comprises a second CMOS inverter biased by the source voltage and having an input and an output, the output of the second CMOS inverter connected to the input of the first CMOS inverter, the input of the second CMOS inverter connected to the damping network.

19. The circuit of claim 18, wherein the damping network comprises:

a resistor connected between the input of the second inverter and the source input; and a capacitor having a first terminal connected to the input of the second inverter and a second terminal that is grounded.

20. The circuit of claim 14, wherein the means for damping the electrostatic discharge comprises:

a first resistor connected between the source input and the gate of the PFET;

an NFET having a drain connected to the gate of the PFET, a source that is grounded, and a gate;

a second resistor having a first terminal connected to the gate of the NFET and a second terminal that is grounded; and a capacitor connected between the source input and the gate of the NFET.

21. The circuit of claim 1, wherein the PFET comprises six slices, wherein each slice comprises forty-eight PFET fingers.

22. The circuit of claim 21, wherein each of the forty-eight PFET fingers per slice comprises a width of 11.4 $\mu$m and a length of 3.5 $\mu$m using 0.35 $\mu$m process technology.

* * * * *